(12) United States Patent
Haga

(10) Patent No.: US 6,307,794 B1
(45) Date of Patent: Oct. 23, 2001

(54) SEMICONDUCTOR MEMORY DEVICE AND SIGNAL LINE SHIFTING METHOD

(75) Inventor: Ryo Haga, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/648,541

(22) Filed: Aug. 28, 2000

(30) Foreign Application Priority Data

Aug. 26, 1999 (JP) .................................................. 11-240168

(51) Int. Cl.⁷ ...................................................... G11C 7/00
(52) U.S. Cl. ...................... 365/200; 365/230.06; 365/240
(58) Field of Search .............................. 365/200, 230.06, 365/230.02, 230.09, 239, 240

(56) References Cited

U.S. PATENT DOCUMENTS

| | | | |
|---|---|---|---|
| 4,228,528 | 10/1980 | Cenker et al. ...................... | 365/200 |
| 4,598,388 | 7/1986 | Anderson .............................. | 365/200 |
| 5,134,584 | 7/1992 | Boler et al. ........................... | 365/200 |
| 6,104,648 | * 8/2000 | Ooishi ................................... | 365/200 |
| 6,115,301 | 9/2000 | Namekawa .......................... | 365/200 |

FOREIGN PATENT DOCUMENTS

411250688-A * 9/1999 (JP) .

* cited by examiner

*Primary Examiner*—Richard Elms
*Assistant Examiner*—Hien Nguyen
(74) *Attorney, Agent, or Firm*—Finnegan, Henderson, Farabow, Garrett & Dunner, L.L.P.

(57) ABSTRACT

A semiconductor memory device comprises: a memory cell array having memory cells arranged in the form of a matrix; a redundant column cell array configured to relieve a defective column of the memory cell array; a decoder circuit configured to decode an address to select a memory cell in the memory cell array; a plurality of data lines, to which data read out from the memory cell array or data to be written in the memory cell array, corresponding to a plurality of columns, is transferred by the decoder circuit; a data line, to which data read out from the redundant column cell array or data to be written in the redundant column cell array is transferred; a data line shift circuit configured to shift, one by one, data line and the spare data line, which are arranged on one side of a data line serving as a starting point, to which data of a defective column is to be transferred when the defective column is accessed, to connect the data line and the spare data lines to data input/output lines; a selecting circuit configured to store a correspondence between the address of the defective column and a shift point, which is assigned to each of the data input/output lines so as to increase by 1 of every starting point of the data line shift by the data line shift circuit, and configured to output a selecting signal corresponding to the shift point when the address of the defective column is inputted; and a shift control circuit configured to output a shift control signal to the data line shift circuit by comparing the selecting signal, which is outputted from the selecting circuit, with the shift point.

20 Claims, 16 Drawing Sheets

| COLUMN ADDRESS → | 0 | 1 | 2 | 3 | 4 | 5 | 6 | 7 |
|---|---|---|---|---|---|---|---|---|
| SELECTING SIGNAL  Z0 → | F00 | F01 | F02 | F03 | F04 | F05 | F06 | F07 |
| Z1 → | F10 | F11 | F12 | F13 | F14 | F15 | F16 | F17 |
| Z2 → | F20 | F21 | F22 | F23 | F24 | F25 | F26 | F27 |

FIG.5

SEMICONDUCTOR MEMORY DEVICE AND SIGNAL LINE SHIFTING METHOD

CROSS REFERENCE TO RELATED APPLICATION

This application is filed on the basis of the right of priority of Japanese Application No. 11-240168 (filed on Aug. 26, 1999), and the entire contents of which are incorporated herein by reference. Moreover, the entire contents described in U.S. application Ser. No. 09/259,274 are incorporated herein by reference.

BACKGROUND OF THE INVENTION

1. Field of the Invention

The present invention relates generally to a semiconductor memory device, such as a DRAM, and a signal line shifting method.

More specifically, the invention relates to a semiconductor memory device and signal line shifting method using a column redundant system for replacing a data line, to which data of a defective column is outputted, with a remaining normal data line and a spare data line by shifting the data line.

2. Related Background Art

Conventionally, in order to relieve defective bits to improve the yield of DRAMs or the like, a redundant circuit system for arranging a redundant cell array for a specific memory cell array is adopted. In a standard redundant circuit system, a fuse circuit for storing defective addresses is mounted in a chip. Then, when a defective address is inputted, the coincidence of the inputted defective address with a defective address stored in the fuse circuit is detected to output a substitution signal. By this signal, a substitution control for selecting a redundant column or a redundant row in place of a defective column or a defective row is carried out.

However, in this conventional redundant circuit system, it is necessary to establish a one-to-one correspondence between defective columns and redundant columns, and thus there is a disadvantage in that it is necessary to provide many redundant circuits in order to enhance the defective relieving efficiency.

On the other hand, as a redundant circuit system for efficiently relieving defective columns by a smaller number of redundant circuits, a system utilizing a data line shift has been proposed (e.g., Japanese Patent Laid-Open No. 3-176899 and No. 5-101648). In this system, when a defective column address is inputted, a data line, to which data of the defective column should be outputted, is avoided, and the next normal data line is used. Subsequently, a data line shift control for sequentially shifting data lines one by one to connect only normal data lines, which include one spare data line arranged on the end portion of the arrangement of data lines, to data input/output lines is carried out.

However, in the defective column relieving system based on the data line shift, if the starting point of the data line shift corresponding to the defective column address is stored to carry out the shift control, when the number of data input/output lines (I/O lines) is large, the number of selecting signal lines for the shift control is large, and as a result the construction of a multiplexer part for the data line shift is complicated.

SUMMARY OF THE INVENTION

It is therefore an object of the present invention to eliminate the aforementioned problems and to provide a semiconductor memory device using a defective column relieving system wherein the number of selecting signal lines for data line shift control is small.

In order to accomplish the aforementioned, and other objects, according to one aspect of the present invention, a semiconductor memory device comprising: a memory cell array having memory cells arranged in the form of a matrix; a redundant column cell array configured to relieve a defective column of the memory cell array; a decoder circuit configured to decode an address to select a memory cell in the memory cell array; a plurality of data lines, to which data read out from the memory cell array or data to be written in the memory cell array, corresponding to a plurality of columns, is transferred by the decoder circuit; a spare data line, to which data read out from the redundant column cell array or data to be written in said redundant column cell array is transferred; a data line shift circuit configured to shift, one by one, data line and the spare data line, which are arranged on one side of a data line serving as a starting point, to which data of a defective column is to be transferred when the defective column is accessed, to connect the data lines and the spare data line to data input/output lines; a selecting circuit configured to store a correspondence between an address of the defective column and a shift point, which is assigned to each of the data input/output lines so as to increase by 1 of every starting point of the data line shift by the data line shift circuit, and output a selecting signal corresponding to the shift point when the address of the defective column is inputted; and a shift control circuit configured to output a shift control signal to the data line shift circuit by comparing the selecting signal, which is outputted from the selecting circuit, with the shift point.

According to a further aspect of the present invention, there is provided a semiconductor memory device comprising: a memory cell array having memory cells arranged in the form of a matrix; a redundant column cell array for relieving a defective column of the memory cell array; a decoder circuit for decoding an address to select a memory cell in the memory cell array; a plurality of data lines, to which data read out from the memory cell array or data to be written in the memory cell array, corresponding to a plurality of columns, is transferred by the decoder circuit; a spare data line, to which data read out from the redundant column cell array or data to be written in the redundant column cell array is transferred; and a data line shift circuit for shifting, one by one, data lines and the spare data line, which are arranged on one side of a data line serving as a starting point, to which data of a defective column is to be transferred when the defective column is accessed, to connect the data lines and the spare data line to data input/output lines; which further comprises first means for establishing a correspondence between addresses and starting points for data line shift, and second means for establishing a correspondence between data input/output line numbers and starting points for data line shift, wherein the first and second means are used for determining a form of data line shift, which is carried out by the data line shift circuit, with respect to an inputted address.

According to a further aspect of the present invention, there is provided a signal line shifting method for a semiconductor memory device which comprises a memory cell array, a redundant column cell array, first signal lines corresponding to the memory cell array, and a second signal line corresponding to the redundant column cell array, wherein when the signal line shifting method shifts, one by one, first signal lines, which are arranged on one side of a first signal line serving as a starting point corresponding to a defective column when the defective column is accessed, to connect the first signal lines and the second signal line to input/output lines, the signal line shifting method comprises the steps of: establishing a correspondence between addresses and starting points for signal line shift; establishing a correspondence between input/output line numbers and the starting points for signal line shift; and inputting a predetermined address to compare the correspondences with each other to determine a form of signal line shift on the basis of the compared result.

BRIEF DESCRIPTION OF THE DRAWINGS

The present invention can be understood more fully from the detailed description given herebelow and from the accompanying drawings of the preferred embodiments of the invention. However, the drawings are not intended to imply limitation of the invention to a specific embodiment, but are for explanation and clarification purposes only.

In the drawings:

FIG. 5 is a table showing the relationship between column addresses and fuses of fuse circuits of the selecting circuit;

DESCRIPTION OF THE PREFERRED EMBODIMENTS

Referring now to the accompanying drawings, the preferred embodiments of the present invention will be described below.

(First Preferred Embodiment)

Figure 1:
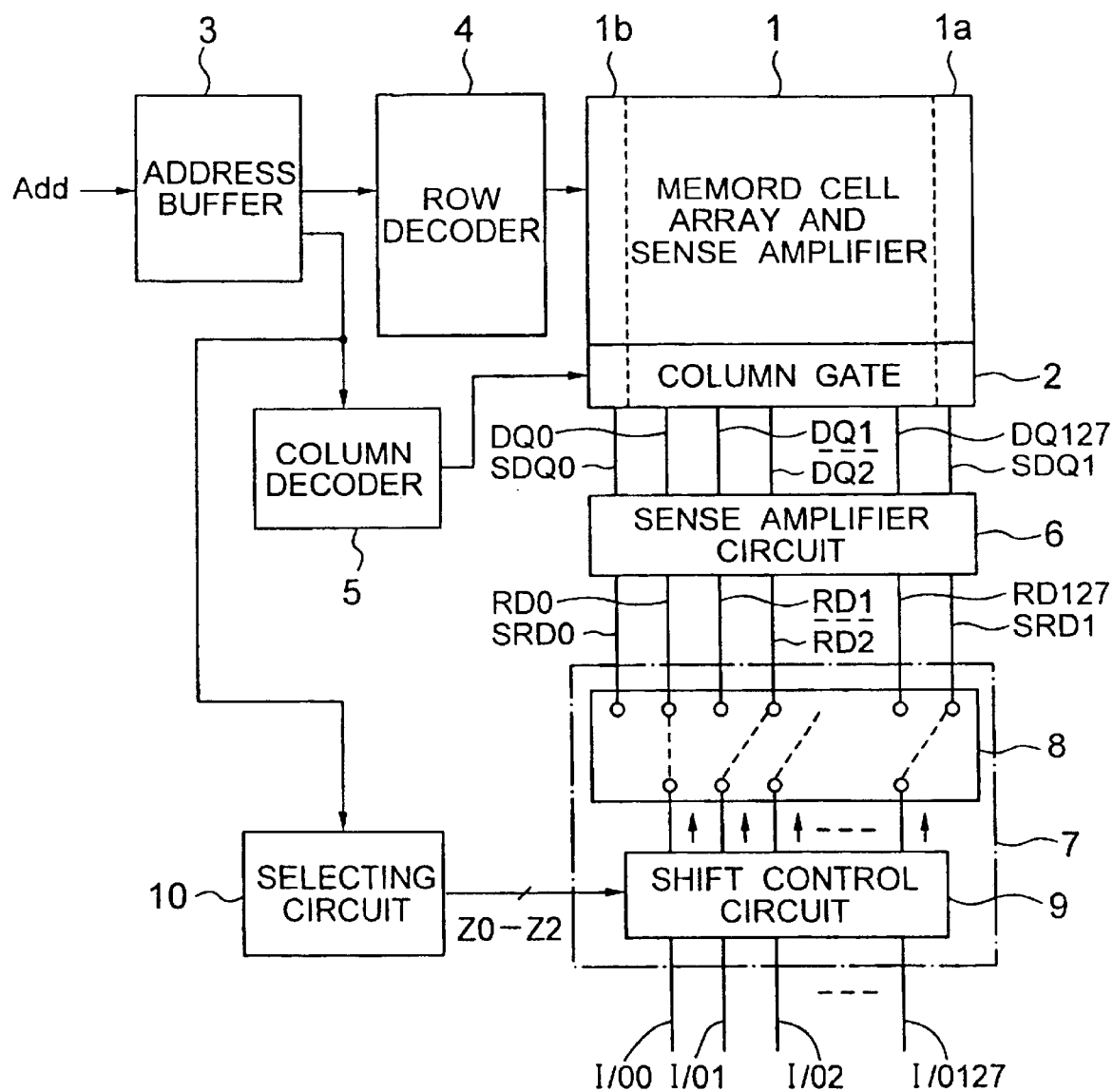
FIG. 1 is a block diagram of the first preferred embodiment of a DRAM according to the present invention.

FIG. 1 is a block diagram of the first preferred embodiment of a DRAM according to the present invention. Although this figure shows only a DRAM part, logic circuit parts comprising gate arrays and standard cells are actually mounted on the same chip.

Figure 2:
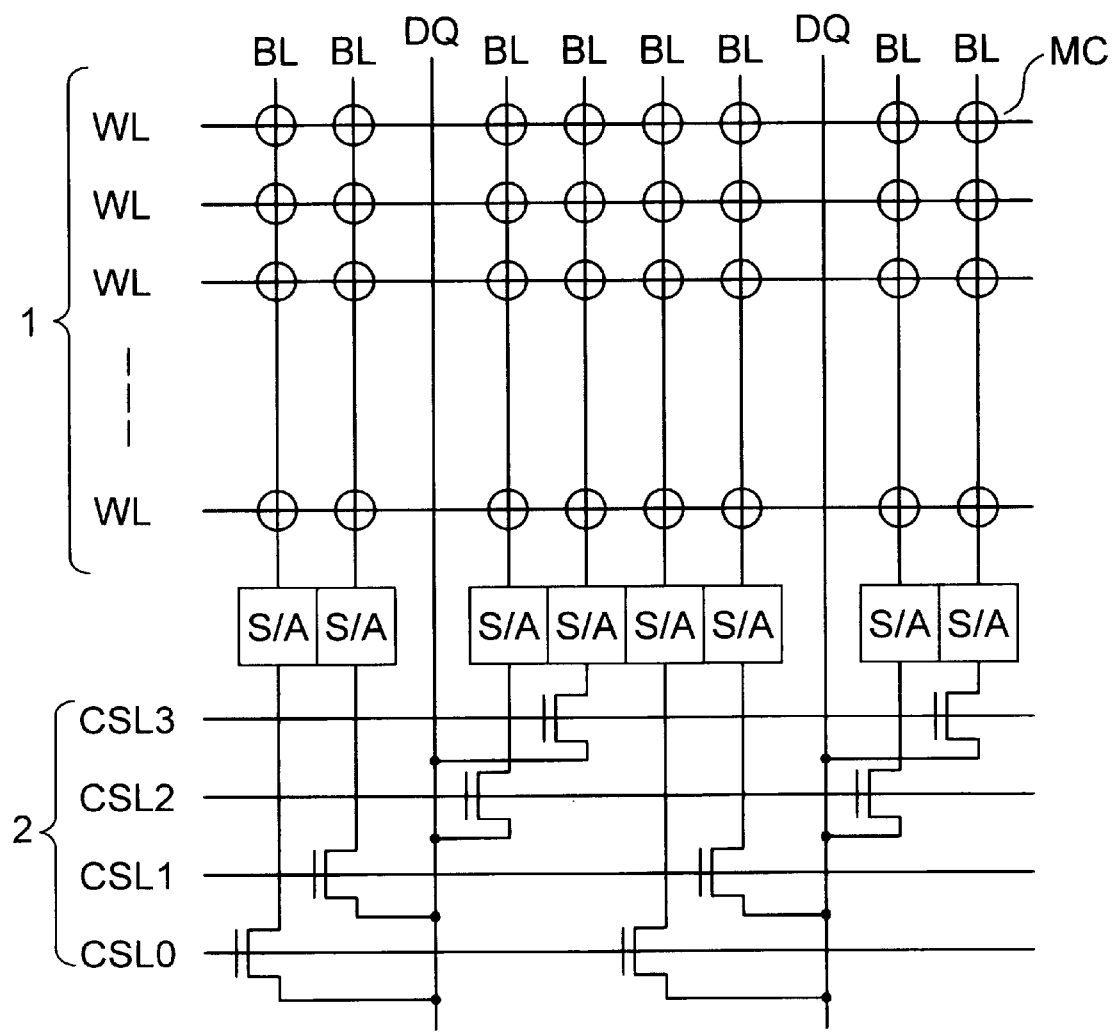
FIG. 2 is a schematic diagram showing the construction of a memory cell array of the DRAM in this preferred embodiment.

As shown in FIG. 2, a memory cell array 1 comprises dynamic memory cells MC which are arranged in the form of a matrix. Each of the memory cells MC is arranged at a corresponding one of the intersections between a plurality of word lines WL and a plurality of bit lines BL (in fact, pairs of bit lines). Each of the bit lines BL is connected to a bit line sense amplifier S/A.

An address is incorporated into an address buffer 3, so that a row address and a column address are decoded by means of a row decoder 4 and a column decoder 5, respectively. The word lines WL and bit lines BL of the memory cell array 1 are selected by means of the row decoder 4 and the column decoder 5, respectively. The bit lines BL of the memory cell array 1 are selected by means of a column gate 2, which is driven by the column decoder 5, to be connected to data lines DQ (DQ0 through DQ127).

In this preferred embodiment, as schematically shown in FIG. 2, the plurality of data lines DQ are arranged in the memory cell array 1 so as to cross the memory cell array 1. The data lines DQ are connected to data lines RD (RD0 through RD127) via a data line sense amplifier circuit 6. The shown data lines RD (RD0 through RD127) are data lines for data readout. Actually, writing data lines are provided in parallel to the respective data lines RD, although the writing data lines are not shown.

In this preferred embodiment, the memory cell array 1 is provided with redundant column cell arrays 1a and 1b on both sides in word line directions, as redundant circuits for relieving defects. The bit lines of the redundant column cell arrays 1a and 1b are connected to spare data lines SDQ0 and SDQ1 via the column gate 2. The spare data lines SDQ0 and SDQ1 are connected to spare data lines SRD0 and SRD1 via the data line sense amplifier circuit 6.

In this preferred embodiment, it is assumed that data of 128 bit lines selected from the memory cell array 1 by the column gate 2 is simultaneously transferred to the 128 data lines DQ during a data reading operation, and that data is simultaneously transferred to the selected 128 bit lines of the memory cell array 1 via the 128 data lines DQ during a data writing operation. At this time, a defective column is relieved by means of a multiplexer 7 for switching the connections between the data lines RD (the data lines WD during the writing operation) and data input/output lines I/O. That is to say, when the address of a defective column is inputted, the multiplexer 7 carries out a data line shift control for avoiding a data line RD, to which the bit line data of the defective column should be outputted, and for shifting the data lines RD one by one and for shifting the data lines RD to the data input/output lines I/O including the spare data line SRD0 or SRD1. In order to carry out such a data line shift control, a selecting circuit 10 is provided. The multiplexer circuit 7 comprises a data line shift circuit 8 and a shift control circuit 9 for carrying out a shift control by means of a control signal which is outputted from the selecting circuit 10.

As will be described later, the selecting circuit 10 has a fuse circuit (a selecting signal holding circuit) for storing correspondences between defective column addresses and shift points each assigned to each data input/output line so as to increase by 1 at every starting point of the data line shift carried out by means of the data line shift circuit 8. The selecting circuit 10 is designed to output a selecting signal corresponding to a shift point when a defective column address is inputted. The shift control circuit 9 in the multiplexer 7 has a fuse circuit (a shift indicating number holding circuit) for holding the shift indicating numbers for every data input/output line. The shift control circuit 9 is designed to output a shift control signal for shifting data lines, which are higher (or lower) than the starting point of the shift, by comparing the shift indicating signal with the selecting signal outputted from the selecting circuit 10.

Figure 3:
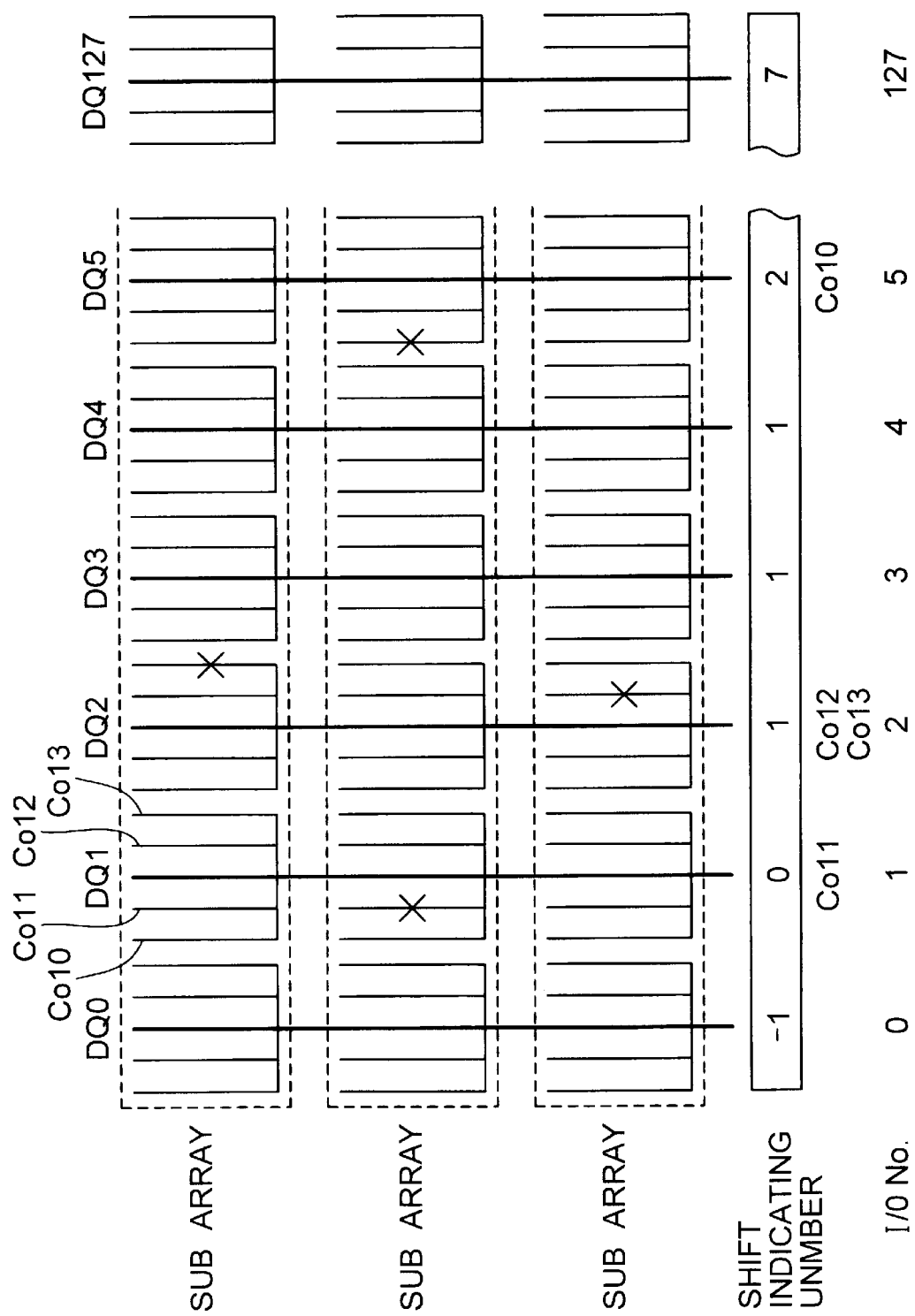
FIG. 3 is a schematic diagram for explaining the principle of a data line shift system in this preferred embodiment.

Before describing the detailed construction of the multiplexer 7 and selecting circuit 10 for carrying out a data line shift for relieving a defective column, the principle of the data line shift in this preferred embodiment will be described referring to FIG. 3. It is assumed that the maximum number of the shift indicating numbers is nine, from −1 to 7, wherein −1 denotes no shift, so that the maximum number of the shift points is eight, from 0 to 7. In FIG. 3, the memory cell array 1 includes a plurality of sub-arrays (three sub-arrays are shown in the figure). Data lines DQ are provided so as to cross the sub-arrays. In each of the sub-arrays, four bit lines (in fact, four pairs of bit lines) of columns Co10 through Co13 from the left are connected to each of the data lines. In this figure, an example of four columns is shown for simple explanation.

In FIG. 3, "X" marks denote the positions of defective columns. That is, in the shown example, the column Co11 in the data line DQ1 is defective, the columns Co12 and Co13 in the data line DQ2 are defective, and the column Co10 in the data line DQ5 is defective. In order to carry out a data line shift when these defective columns are accessed, a shift indicating number assigned to each of the data input/output lines is used in this preferred embodiment. As shown in FIG. 3, the shift indicating number is a number increasing by 1 every time a defective column appears, in the order of the arrangement of the data lines regardless of the defective column address. That is, in the example of FIG. 3, the data line DQ0 has no defective column from the left of the arrangement of the data lines, so that "−1" is assigned as the shift indicating number. Since the column Co11 in the data line DQ1 is defective, the shift indicating number increases by 1 to be "0". Since the columns Co12 and C13 in the data line DQ2 are defective, the shift number further increases by 1 to be "1". Since the data lines DQ3 and DQ4 have no defective column, the same shift indicating number "1" as that in the data line DQ2 is assigned. Subsequently, data line shift indicating numbers, which increase by 1 every time a defective column appears, are similarly set.

In this preferred embodiment, the shift indicating numbers are indicated by nine numbers of −1 through 7 using 4 bits which include 3 bits for shift point and 1 bit for disable. The number "−1" denotes a disable state. The shift points correspond to the number of defective columns. When eight defective columns exist, the shift points of "0" through "7" are used.

In addition, shift indicating numbers of not less than "0" mean to carry out a shift. For example, if "Co11" is inputted as a column address, the shift point corresponding to this column address is "0", so that data input/output lines having shift indicating numbers of not less than 0 are to be shifted. That is, a data input/output line I/O1 to be connected to the data line DQ1 is not connected thereto, and instead is connected to the next data line DQ2. Subsequently, the connections of the data input/output lines to the data lines are sequentially shifted one by one, and the final data input/output line I/O127 is connected to the spare data line SRD1. Similarly, when Co12 or Co13 is inputted as a column address, the data line DQ2 and subsequent data lines are to be shifted, and when Co10 is inputted, the data line DQ5 and subsequent data lines are to be shifted.

Only the data line shift in one direction has been described above. However, as shown in FIG. 1, if the redundant column cell arrays 1a and 1b are arranged on both sides of the memory cell array 1 and if the spare data lines (SDQ1, SRD1) and (SDQ0, SRD0) are arranged so as to correspond thereto, the data line shift are carried out in both directions. For example, if there are two defects, the data line is shifted to the right with respect to the right side defect, and the data line is shifted to the left with respect to the left side defect.

As described above, in order to determine the starting point of the data line shift when an address is actually inputted, if the shift indicating numbers are set with respect to the respective data input/output lines, it is necessary to use information for determining how many shift points the data input/output line (I/O No.=0~127) shown in FIG. 3 have, and information for determining which number of column has which number of shift point. In this preferred embodiment, the shift indicating numbers of the former information are held in the shift control circuit 9 of FIG. 1 as fuse information, and the shift points of the latter information are held in the selecting circuit 10 of FIG. 1 as fuse information.

Figure 4:
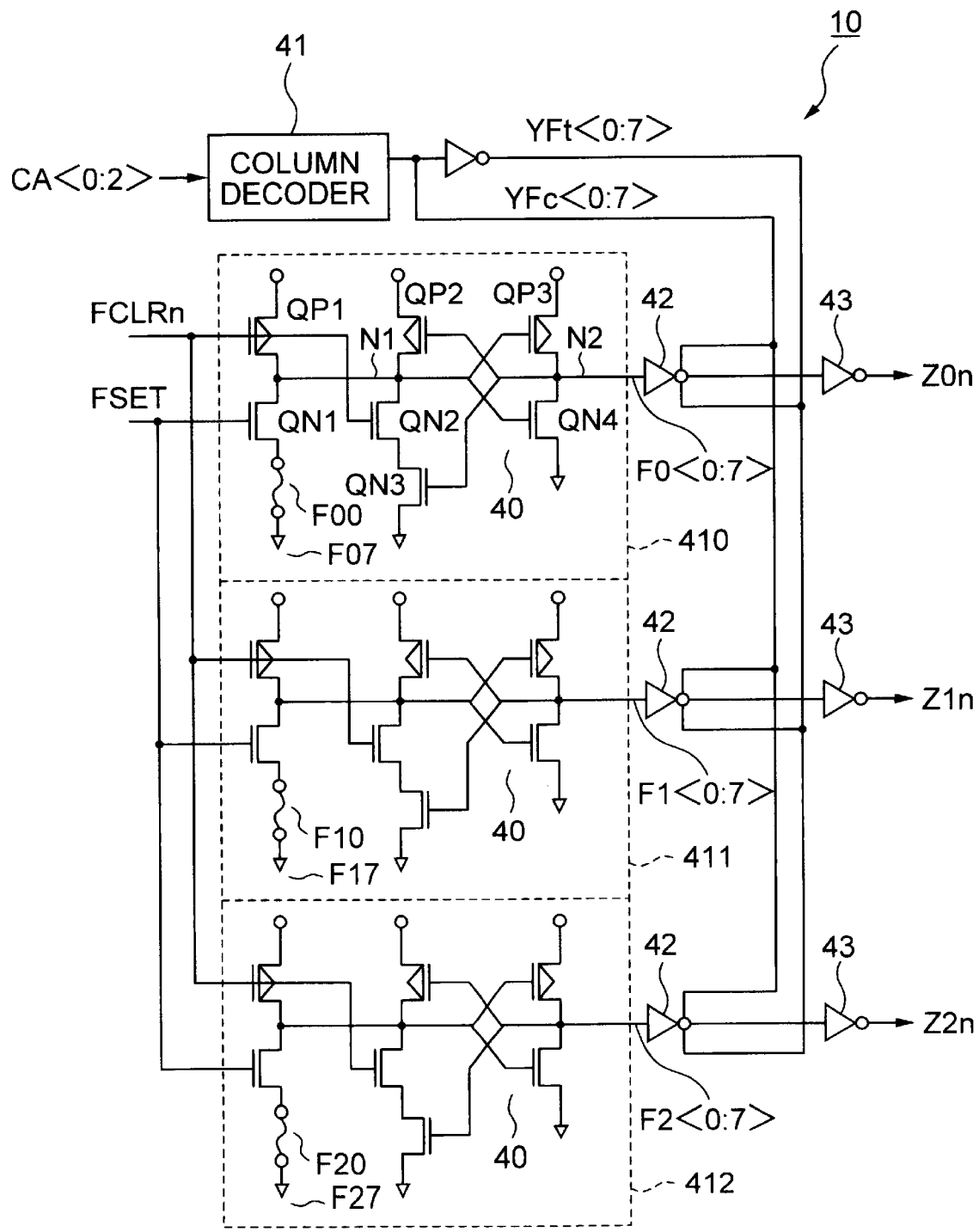
FIG. 4 is a circuit diagram of a selecting circuit of the DRAM in this preferred embodiment.

FIG. 4 shows the construction of the selecting circuit 10. In this example, eight (3 bits) shift points are assigned to eight (3 bits) column addresses CA<0:2>. Therefore, as shown in FIG. 5, the number of columns×3 fuses F00 through F07, F10 through F17 and F20 through F27 are used. These fuses may be fuses of any one of a type for carrying out a programming by utilizing fusion by means of a laser (a laser programming type), and a type for carrying out a programming by disconnecting or conducting between terminals by applying a voltage (or current) (an electrical programming type), but preferably are fuses of the electrical programming type. Fuse circuits 410, 411 and 412, each of which has eight fuses, have the same construction so as to correspond to 3 bits of the shift points. Each of the fuse circuits 410, 411 and 412 has a latch circuit 40, which comprises NMOS transistors QN3 and QN4 and PMOS transistors QP2 and QP3, for latching fuse data.

As described above in reference to FIG. 3, each bit data of shift points, which is set in accordance with a defective column address, is programmed in the fuses F00 through F07, F10 through F17 and F20 through F27. The node N1 of each of the latch circuits 40 is connected to a corresponding fuse terminal via an NMOS transistor QN1, and to a power supply Vcc via a PMOS transistor QP1. Between the node N1 and the NMOS transistor QN3, an NMOS transistor QN2 for causing the temporary stall of the latch circuit 40 is provided.

The transfer of the programmed fuse data to the latch circuit 40 is controlled by a clear signal FCLRn and a set signal FSET. That is, after a power supply is turned on, FCLRn=L is first established, and the NMOS transistor QN2 is turned off, so that the latch circuit 40 stalls. In this state, the node N1=H is preset via the PMOS transistor QP1. Then, FCLRn=H and FSET=H are established. Accordingly in accordance with the disconnection or connection of the fuse, the node N1 remains being held in H level or becomes in L level. Thus, fuse data is set in the latch circuit 40.

To the selecting circuit 10, the column addresses CA<0:2> are inputted. The inputted column addresses are decoded by a column decoder 41 to be complementary signals YFt<0:7> and YFc<0:7>. Each of the seven nodes N2 of the latch circuit 40 of each of the fuse circuits 410, 411 and 412 is provided with a clocked inverter 42 which is controlled by the decoded complementary signals YFt<0:7> and YFc<0:7>. Thus, 3 bits are taken out of F0<0:7>, F1<0:7> and F2<0:7>, each having eight fuse data, of each of the fuse circuits 410, 411 and 412 in accordance with the inputted column address, so that 3-bit fuse data (i.e., selecting signals) Z0n, Z1n and Z2n are outputted via an inverter 43. When a defective column address is inputted, the selecting signals Z0n, Z1n and Z2n have data corresponding to the shift indicating number set in accordance with the defective column positions as described referring to FIG. 3, and when the column is normal, all of the selecting signals Z0n, Z1n and Z2n have "1" (=H). That is, when a non-defective column address is inputted, a selecting signal, which is different from the shift indicating number held in the shift indicating number holding circuit, is outputted.

Figure 6:
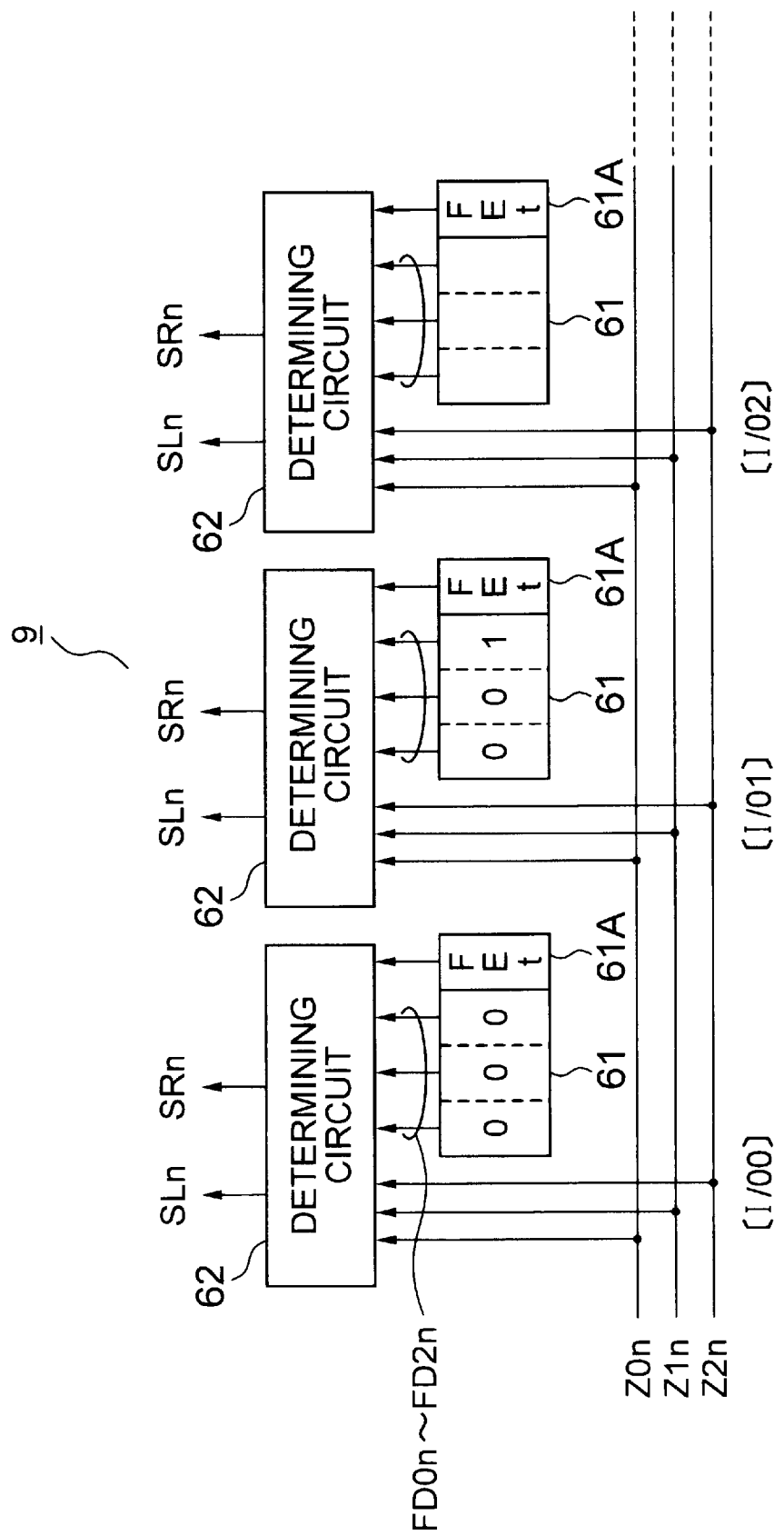
FIG. 6 is a block diagram of a shift control circuit of the DRAM in this preferred embodiment.

FIG. 6 shows the construction of the shift control circuit 9, to which the 3-bit selecting signals outputted from the selecting circuit 10 in accordance with the column addresses are supplied. The shift control circuit 9 is provided for each of the data input/output lines, and has a shift indicating number holding circuit 61 for holding shift indicating numbers set for every data input/output, as fuse data and a determining circuit 62 for comparing the fuse data of the holding circuit 61 with the selecting signals fed from the selecting circuit 10 to output shift control signals SLn and SRn. The shift control signals SLn and SRn are signals indicative of left shift and right shift, respectively. Furthermore, a holding circuit 61A for holding one bit in the shift indicating number holding circuit 61 is provided for holding the shift indicating number "−1" indicative of a disable state, and is designed to control the data line shifting circuit so as to prevent any shifts regardless of column addresses, with respect to the data input/output line, to which "−1" has been assigned as the shift indicating number.

Figure 7:
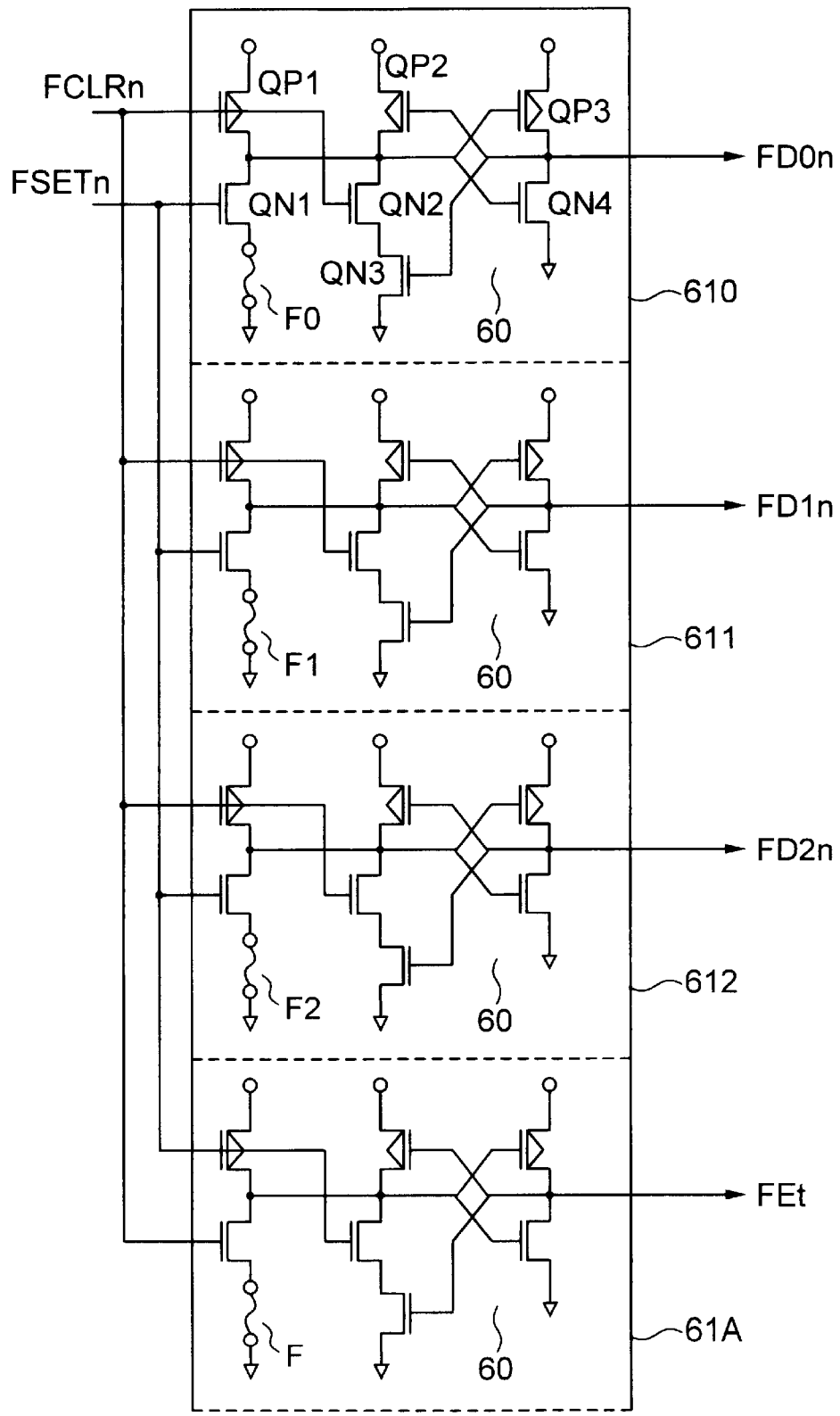
FIG. 7 is a circuit diagram showing the construction of a fuse circuit of the shift control circuit of FIG. 6.

As shown in FIG. 7, the shift indicating number holding circuit 61 comprises fuse circuits 610 through 612 which has the same construction as that of the holding circuit 61A for holding the shift indicating number "−1" and which has fuses F0 through F2, in which the 3-bit shift point assigned to each of the data input/output lines is programmed as the shift indicating number. These fuses may be fuses of any one of the laser programming type and the electrical programming type, but preferably are fuses of the electrical programming type. Each of the fuse circuits 610 through 612 and 61A has a latch circuit 60 for holding data FD0n through FD2n and FEt of the programmed fuses F0 through F2 and F, and is latch-controlled by control signals FCLn and FSET. These fuse circuits are the same as the fuse circuits 410 through 412 of the selecting circuit 10 of FIG. 4, so that the detailed descriptions thereof are omitted.

The determining circuit 62 is a kind of decoder circuit for comparing the 3-bit fuse data FD0n through FD2n (i.e., the shift indicating numbers) of the shift indicating number holding circuit 61 with the selecting signals Z0n through Z2n (or the corresponding shift indicating numbers when a defective column address is inputted) fed from the selecting circuit 10, with respect to data input/output lines other than those indicated by the 1-bit fuse data FEt that no shift should be carried out. Based on the comparison result, the determining circuit 62 outputs a shift control signal SRn=L (or SLn=L) indicating a shift with respect to the data lines on the right side (or the left side) of the data line at which the fuse data is coincident with the selecting signal. When a column address other than the defective column address is inputted, SLn=SRn=H. That is, in the example of FIG. 3, when an address for reading data of column Co11 is inputted, SLn=L is outputted to the second and subsequent data input/output lines I/O so that the second and subsequent I/O lines I/O1 are not connected to the data line DQ1 but are connected to data lines shifted one by one.

Figure 8:
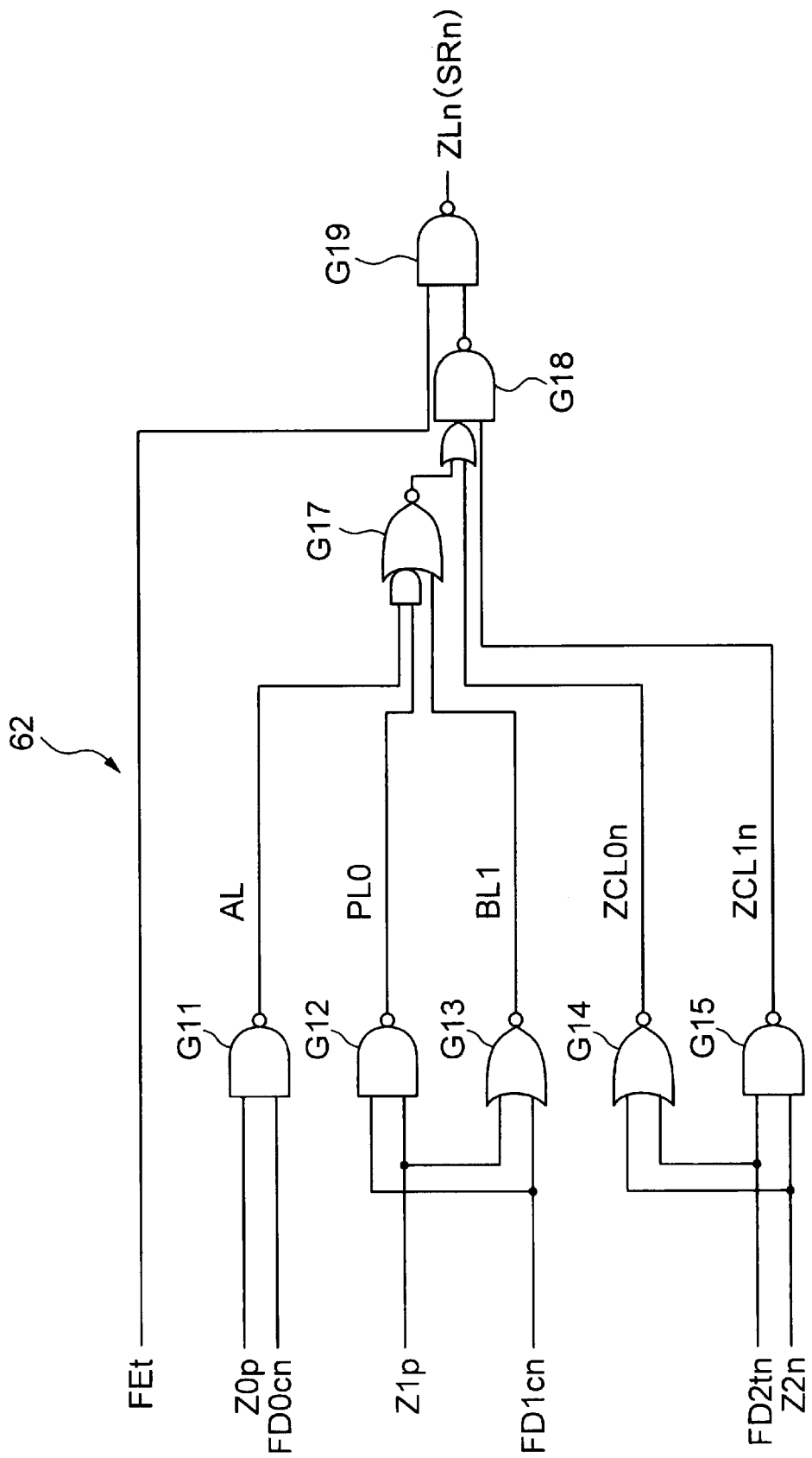
FIG. 8 is a circuit diagram showing the construction of a determining circuit of the shift control circuit of FIG. 6.

Specifically, the determining circuit 62 is constructed as shown in FIG. 8. Although this figure shows a part for outputting the shift control signal SLn for controlling the left shift, a part for outputting the shift control SRn for controlling the right shift has the same construction. In brief, when the shift indicating number is −1, the input FEt is L, and the output SLn is H. When the output SLn is H, no shift is carried out. When the shift indicating number is 0 or more, the FEt is H. In this case, the output SLn is determined by the logic of other inputs FDn and Zn, and a shift is carried out with respect to the defective column address. More specifically, with respect to the other inputs, there is incorporated a logic for comparing complementary data signals (FD0tn, FD0cn) through (FD2tn, FD2cn) corresponding to the respective fuse data FD0 through FD2 of the shift indicating number holding circuit 61 with the selecting signals Z0n through Z2n outputted from the selecting circuit 10 for every corresponding bit, to determine the relationship between the sizes thereof. That is, SLn="H" is outputted up to a data line, at which the selecting signals Z0n through Z2n are coincident with the fuse data FD0n through FD2n, and SLn="L" is outputted with respect to subsequent data lines.

Figure 9:
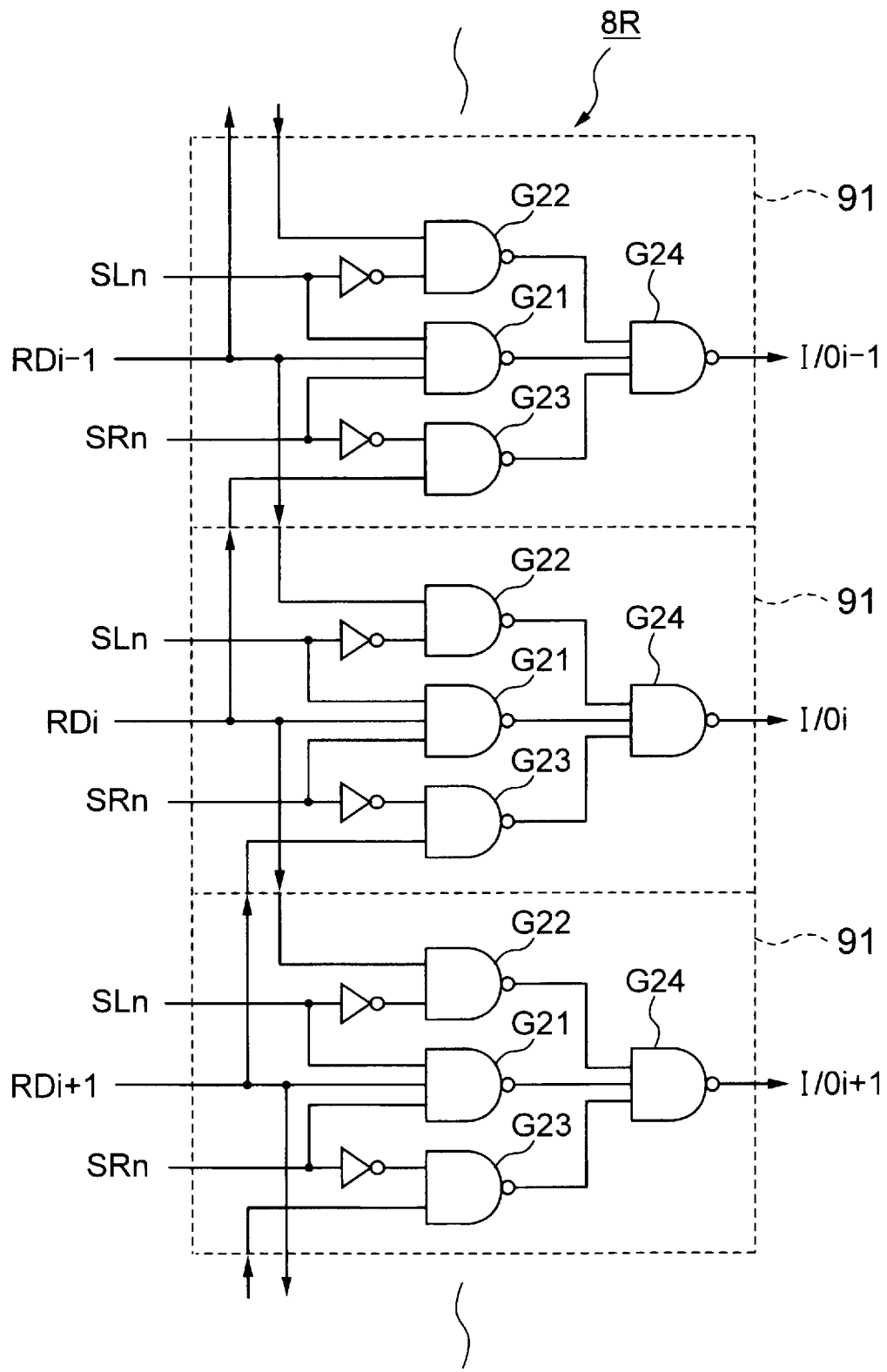
FIG. 9 is a circuit diagram showing the construction of a data reading part of a data line shift circuit of FIG. 1.
Figure 10:
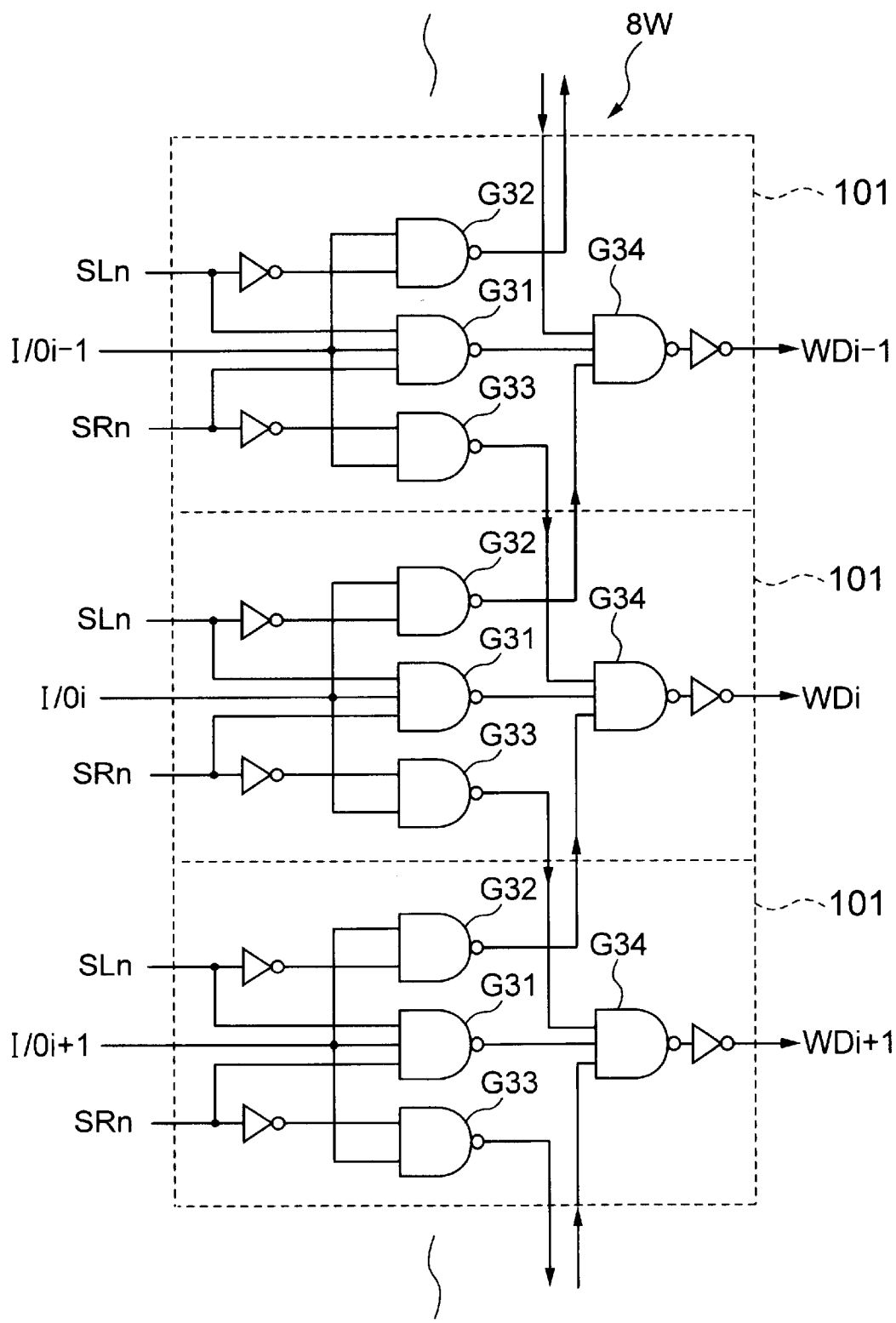
FIG. 10 is a circuit diagram showing the construction of a data writing part of the data line shift circuit of FIG. 1.

As described above, the data line shift circuit 8 controlled by the shift control signals SLn and SRn generated by the shift control circuit 9 is formed as a shift circuit 8R shown in FIG. 9 for a data reading operation, and as a shift circuit 8W shown in FIG. 10 for a data writing operation. The reading shift circuit 8R will be described. A unit gate circuit 91 mainly comprising NAND gates G21 through G24 is provided for each of the data lines RDi. The shift control signals SLn and SRn corresponding to data of the data lines RDi enter the NAND gate G21, and data of the data lines RDi also simultaneously enters the NAND gates G23 and G22 of a unit for adjacent data lines RDi−1 and RDi+1.

For example, if attention is paid to the data line RDi, when the shift control signals SLn=H and SRn=H, data of the data line RDi passes through the NAND gate G21 and to further pass through the NAND gate G24 to be taken out by a corresponding one of the input/output lines I/Oi. If the shift control signal SLn=L with respect to the data line RDi, the NAND gate G21 of the data line RDi is inactive, and the NAND gate G22 becomes active in place thereof. Thus, data of the next data line RDi−1 passes through the NAND gate G22, and to further pass through the NAND gate G24 to be taken out by the input/output line I/Oi in place of data on the data line RDi. That is, the data lines are shifted.

The control of the right shift using SRn=L is the same.

As shown in FIG. 10, also with respect to the shift circuit 8 W for a data writing operation, a unit gate circuit 101 mainly comprising NAND gates G31 through G34 is provided for each of writing data lines WDi (which are omitted from FIG. 1 as described above). In this case, shift control signals SLn and SRn corresponding to wiring data of the data input/output lines I/Oi enter the NAND gate G31, and the same writing data also simultaneously enters the NAND gates G32 and G33 in the same unit gate circuit 101. These NAND gate G32 and G33 are activated when the shift control signals SLn and SRn=L, respectively, and their outputs enter the NAND gate G34 of an adjacent unit gate circuit.

For example, if attention is paid to the data input/output line I/Oi, when the shift control signals SLn=H and SRn=H, data of the I/Oi passes through the NAND gate G31 and further to pass through the NAND gate G34 to be transferred to a corresponding one of the data lines WDi. With respect to the data input/output line I/Oi, if the shift control signal SLn=L, the corresponding NAND gate G31 is inactive, and the NAND gate G32 becomes active in place thereof. Thus, data of the data input/output line I/Oi passes through the NAND gate G32 to pass through the NAND gate G34 of an adjacent unit gate circuit to be transferred to the next data line WDi−1. That is, data is avoided being transferred to the data line WDi, and transferred to the data line WDi−1 which is shifted by one.

The control of the right shift using SRn=L is the same.
(Second Preferred Embodiment)

In the above described preferred embodiment, the fuse circuit 61 has been arranged for each of the data input/output lines as shown in FIG. 6, in order to hold eight (3 bits) shift points for each of the data input/output lines. However, since a usually fuse requires a large layout area, the area penalty is great if three fuse circuits are arranged for each of the data input/output lines.

Figure 11:
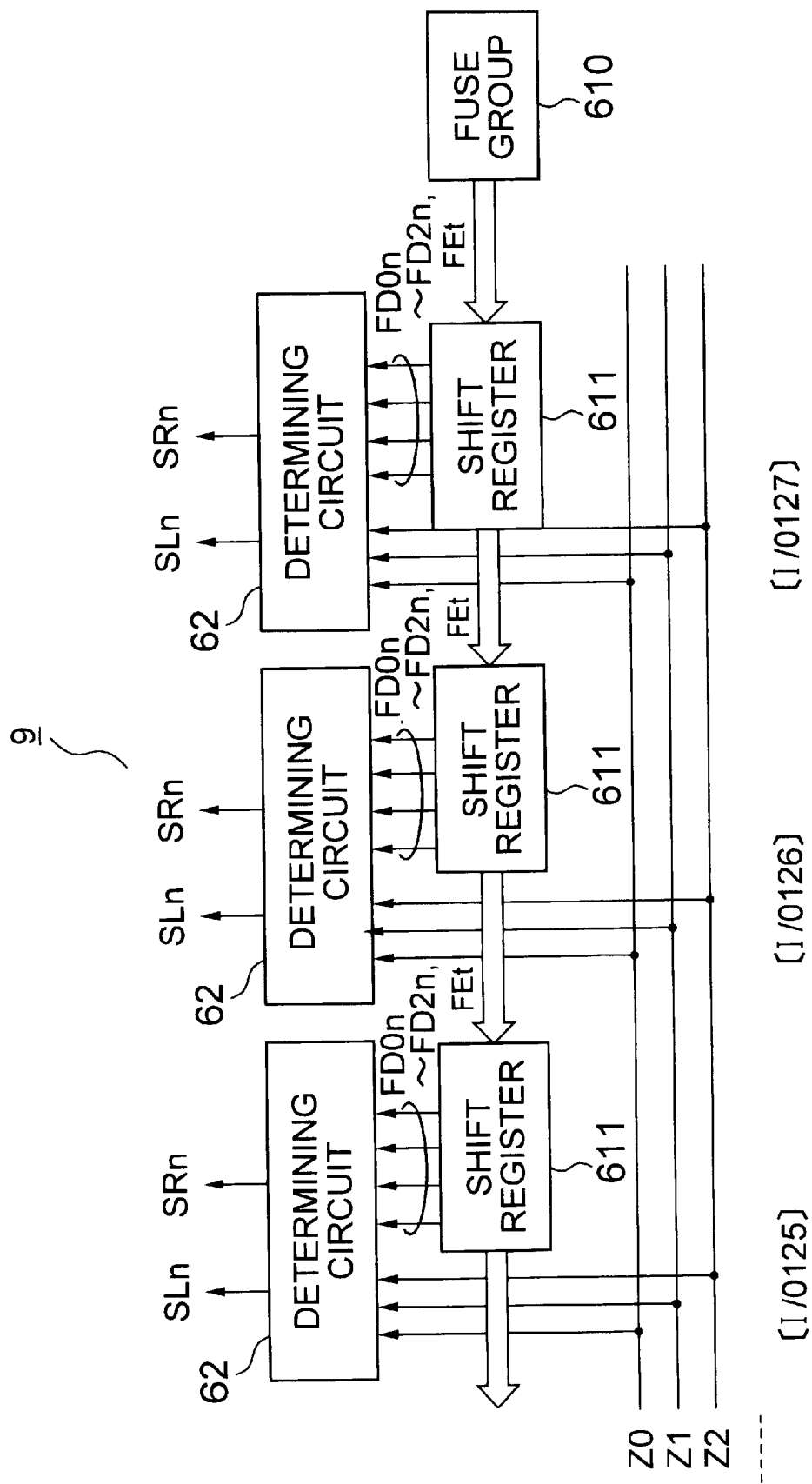
FIG. 11 is a block diagram showing the construction of a shift control circuit of the second preferred embodiment of a DRAM according to the present invention.

FIG. 11 shows the construction of a preferred embodiment of a shift control circuit 9 according to the present invention for which the above described point is improved, so as to correspond to FIG. 6. In this preferred embodiment, a fuse group 610 of fuse circuits is arranged outside of the arrangement of I/O lines, and shift registers 611 for sequentially transferring and holding fuse data are arranged at the respective positions of data input/output lines. The fuse data of the fuse group 610 is automatically read out in the initial operation when a power supply is turned on, and transferred to the shift registers 611, so that shift indicating numbers set for each of data input/output lines are held similarly to the preceding preferred embodiment.

Figure 12:
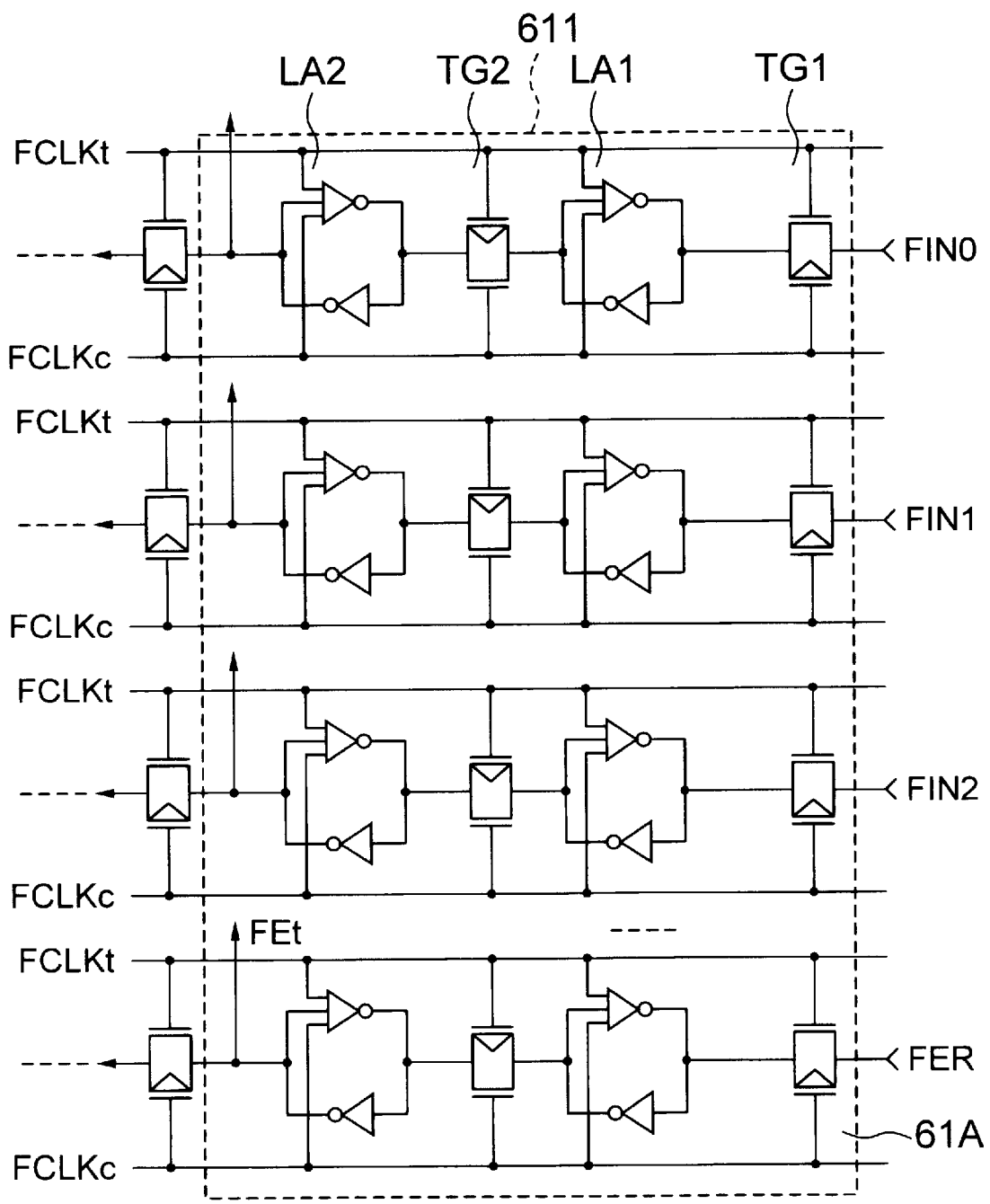
FIG. 12 is a circuit diagram showing the construction of shift register of FIG. 11.

As shown in FIG. 12, each of the shift registers 611 comprises transfer gates TG1 and TG2 which are arranged so as to correspond to 3-bit fuse data FIN1 and FIN2, respectively, and which are alternately driven by complementary clocks FCLKt and FCLKc, and latch circuits LA1 and LA2 for holding data which is transferred from the transfer gates TG1 and TG2. The circuit 61A for outputting 1-bit fuse data FEt has substantially the same construction.

According to this preferred embodiment, by arranging the fuse group requiring a large area outside of the wiring area for data input/output lines, it is possible to reduce the area penalty caused by the fuse circuits for storing and holding the shift indicating numbers.
(Third Preferred Embodiment)

Figure 13:
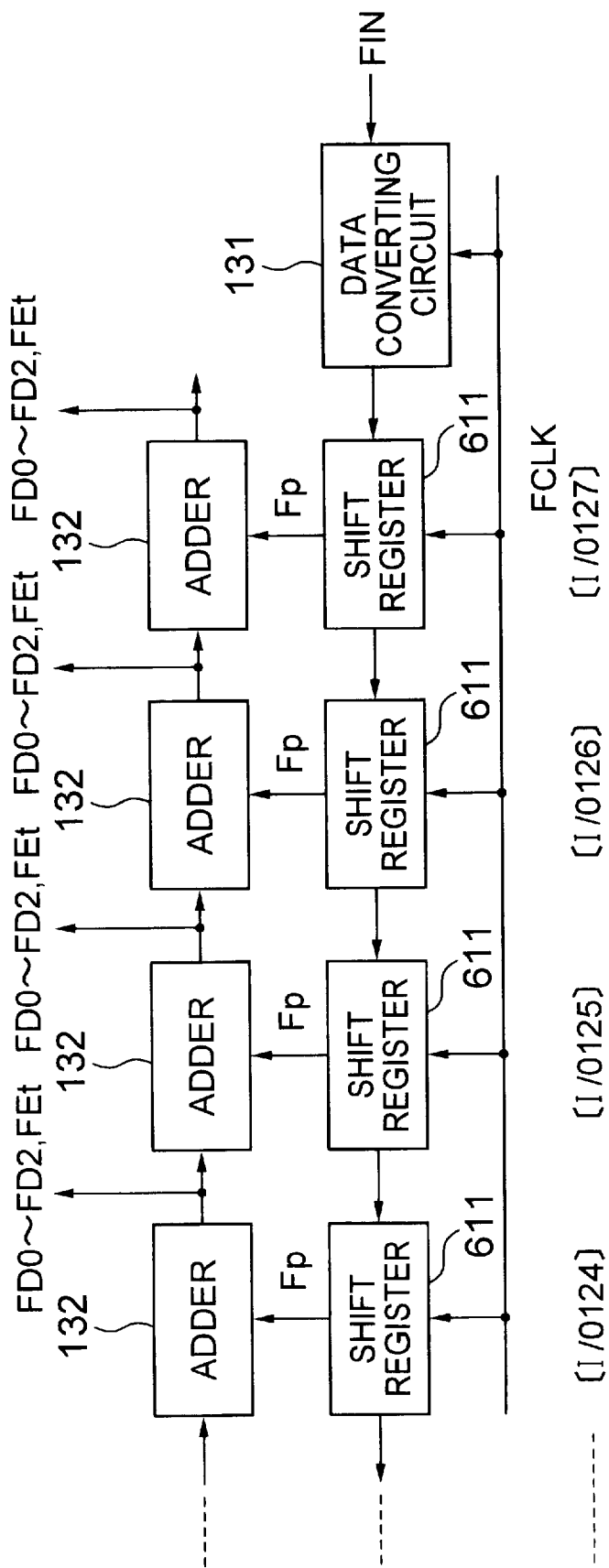
FIG. 13 is a block diagram showing the construction of a principal part of a shift control circuit of the third preferred embodiment of a DRAM according to the present invention.
Figure 14:
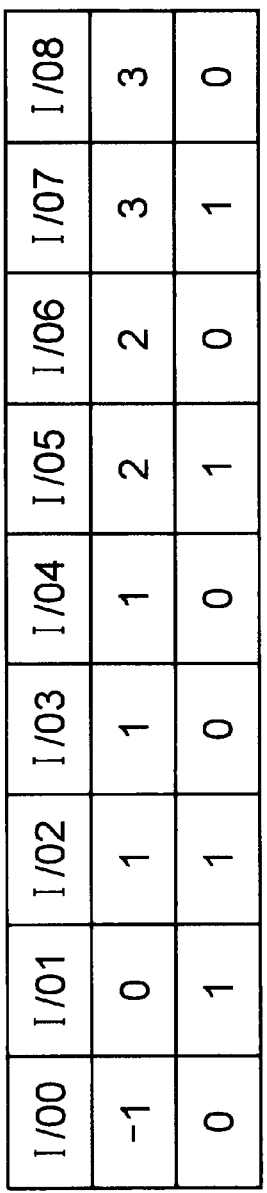
FIG. 14 is a table showing an example of data transferred to and held in a shift register of FIG. 13.

In the above described second preferred embodiment, the 3-bit shift registers 611 of the shift control circuit 9 are provided for each of the data input/output lines so as to correspond to the 3-bit shift points. However, 1-bit shift registers 611 and adders 132 may be provided for each of the data input/output lines as shown in FIG. 13. Each of the adders 132 is designed to output fuse data FD0 through FD2 serving as 3-bit shift points. In this case, in the shift registers 611, fuse data Fp which is "1" (=H) at the position of I/O where the shift indicating number is incremented, is set as shown in FIG. 14 by data input from the larger shift indicating number (data input from the side of I/O127 in the case of FIG. 13). Then, at the position of I/O where the shift register 611 has Fp="1", the adder 132 is designed to add Fp to the output of the adder in the subsequent stage in shift directions to output a desired shift indicating number.

Figure 15:
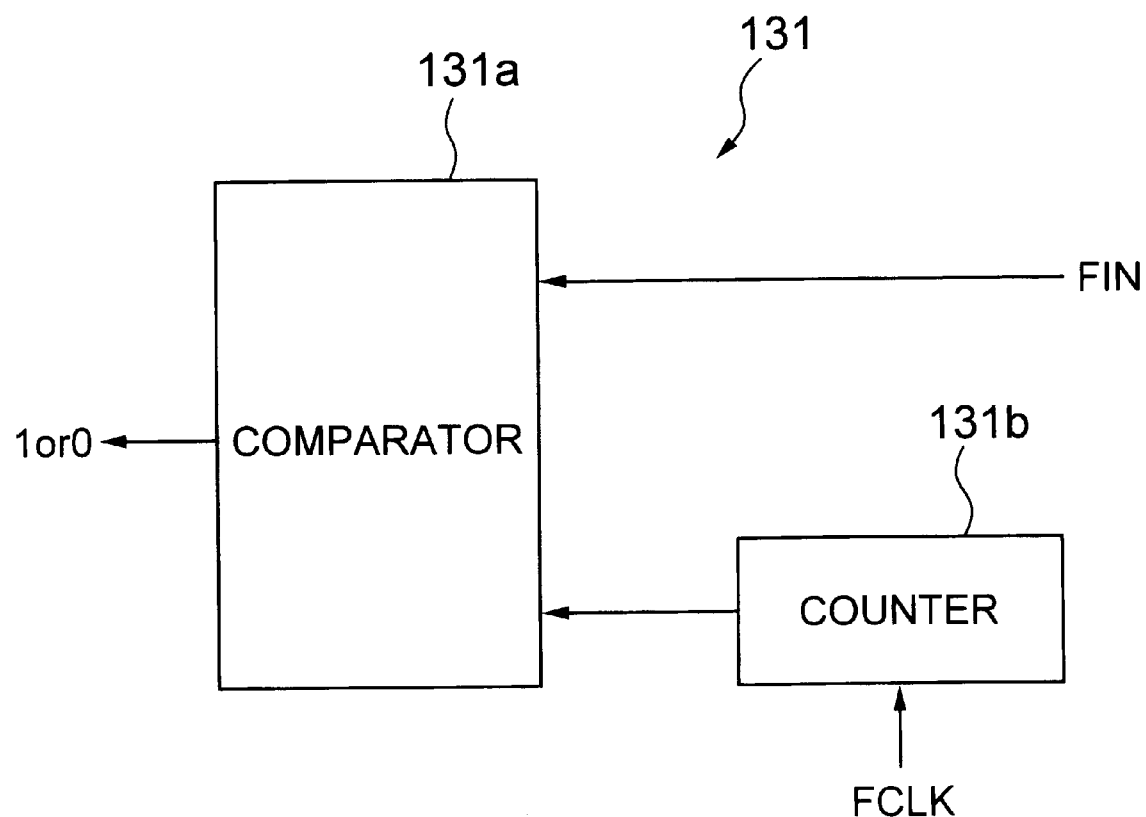
FIG. 15 is a block diagram showing the construction of a data converting circuit of FIG. 13.

In FIG. 13, a data converting circuit 131 is a circuit for converting a 3-bit signals FIN, which has fuse data, into 1-bit data which is "1" at the increment position and "0" at other positions. As shown in FIG. 15, the data converting circuit 131 may include, e.g., a counter 131b and a comparator 131a. As shown in FIG. 14, a shift indicating number is a figure which increases by 1 at each of shift starting points in order from, e.g., a small number, of the data input/output lines. Therefore, at the same time that the counter 131b counts a clock FCLK, the comparator 131a compares fuse data FIN with a counted value. If "1" is set when both are the same and if "0" is set when the counted value is larger, it is possible to obtain fuse data Fp which is to be transferred to the shift register 611 and which is "1" at the increment position of the shift indicating number, as shown in FIG. 14.

Figure 16:
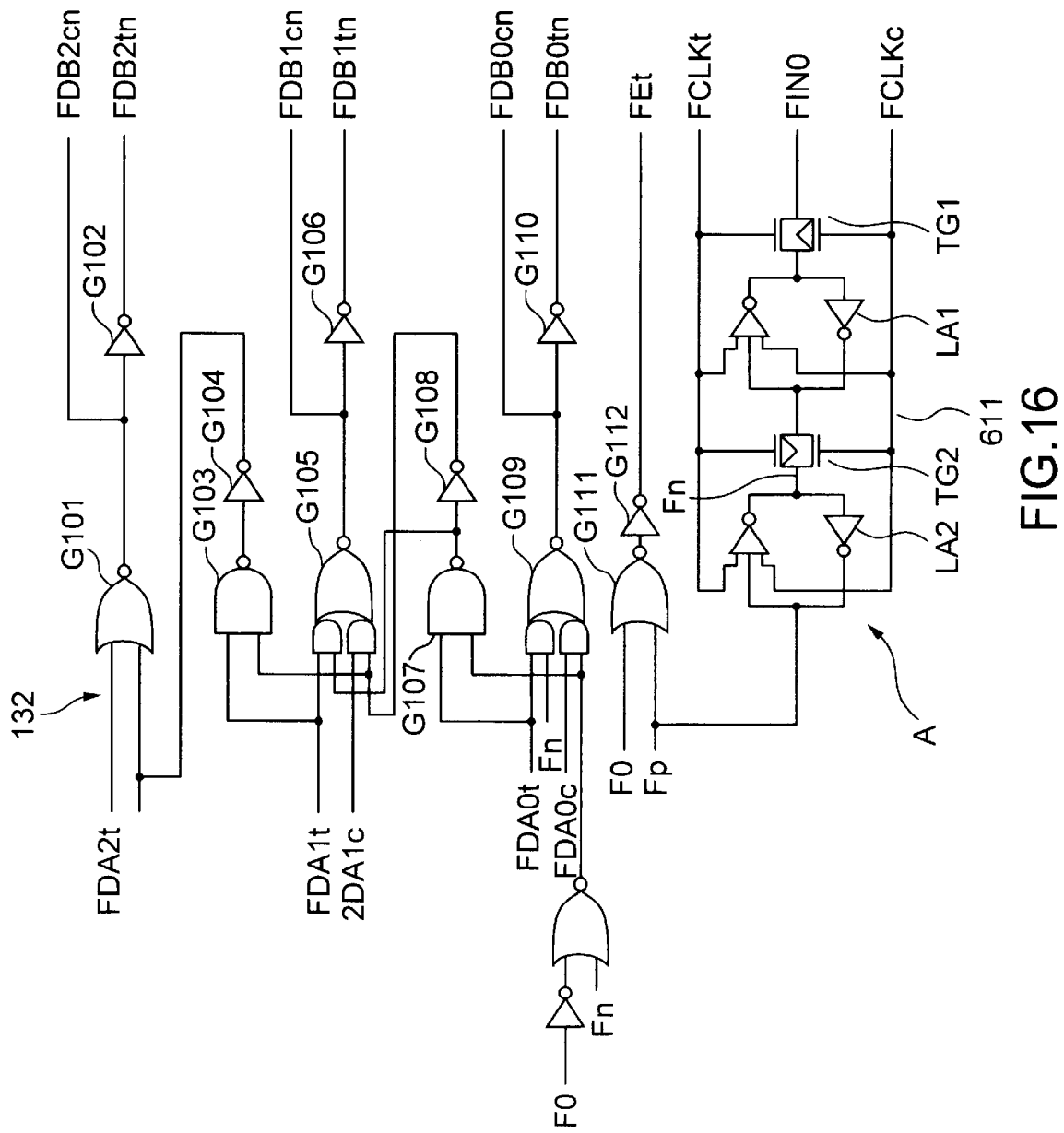
FIG. 16 is a circuit diagram of an adder of FIG. 13.

FIG. 16 shows the detailed constructions of the shift register 611 and adder 132 in an optional stage in FIG. 13. As in the case of FIG. 12, the shift register 611 comprises latch circuits LA1 and LA2 concatenated via transfer gates TG1 and TG2. The adder 132 comprises gates G101 through G110. With respect to the fuse data FD0 through FD2 which are 3-bit outputs of each of the adders 132 shown in FIG. 13, in the adder 132 shown in FIG. 16, data from the last stage is shown by FDA0 through FDA2, and data in the corresponding stage is shown by FDB0 through FDB2.

The detailed description of the circuit of FIG. 16 is omitted. In brief, when the shift indicating number is −1, no addition is carried out by the adder 132, and when the shift indicating number is 0–7, addition is carried out.

More specifically, FIG. 16 shows a circuit, provided for each of the data lines, for holding the shift indicating number.

That is, the plurality of circuits shown in FIG. 16 are arranged in right and left directions, and the output of the left circuit is added to the input of the right circuit.

A portion shown by A in the figure comprises a shift register, and fuse data provided outside of this circuit is transferred in synchronism with a clock (FCLKt, FCLKt) when the chip is raised.

An FIN is connected to an FOUT of the same circuit provided in the next I/O on the right side in the figure, and the FOUT is an input to the FIN of the same circuit provided in the next I/O on the left side.

At a place where a shift indicating number is incremented, the Fn has "L" level, and the FOUT has "H" level. At a place where no shift indicating number is known, the Fn has "H" level, and the FOUT has "L" level.

A portion shown by B in the figure is an adder portion for incrementing a shift indicating number in accordance with the values of Fn and Fp. To F0, FDA0c, FDA0t, FDA1c, FDA1t and FDA2t, FEt, FDB0t, FDB0c, FDB1t, FDB1c and FDB2t of the same circuit provided on the left side are inputted, respectively. In addition, FEt, FDB0t, FDB0c, FDB1t, FDB1c and FDB2t of this circuit are inputs to F0, FDA0c, FDA0t, FDA1c, FDA1t and FDA2t of the next same circuit on the right side.

The FEt, FDB0c, FDB1c and FDB2t are also used as inputs to the shift part shown in FIG. 8, to control the shift.

The inputs to this circuit in the data line at the left end are F0="L", FDB0t="H", FDB0t="H", FDB1c="H", FDB1t="L" and FDB2t="L". At this time, if Fp="L" and Fn="H", FEt="L" (F0 in the next data line) from F0="L" and Fp="L". In addition, the values of FEt, FDB0t, FDB0c, FDB1t, FDB1c and FDB2t are equal to F0, FDA0c, FDA0t, FDA1c, FDA1t and FDA2t, respectively, so that the value of an input signal to this circuit is equal to the value of an input signal to the next circuit on the right side.

At this time, FEt="L", so that this data line is not shifted even if any kind of column address is inputted, as can be seen from FIG. 8. This state is indicated by the shift indicating number="−1".

As the shift number indicating circuit is viewed from the left end, addition first occurs when Fp="H" and Fn="L" are first established. At this time, FEt="H" from F0="L" and Fp="H". On the other hand, no addition occurs in this portion from F0="L" and Fn="H", and FDB0t, FDB0c, FDB1t, FDB1c and FDB2t are equal to FDA0c, FDA0t, FDA1c, FDA1t and FDA2t, respectively (FDB0c="H", FDB0t="L", FDB1c="H", FDB1t="H" and FDB2t="L"). This state is indicated by the shift indicating number "0". Since F0="H" in the next stage from FEt="H", F0="H" and FEt="H" in all data lines on the right side from here.

Thereafter, in the portion of Fp="L" and Fn="H" again, no addition occur because F0="H" and Fn="L".

Thereafter, if there is a place wherein Fp="H" and Fn="L", addition with respect to FDA0c, FDA0t, FDA1c, FDA1t and FDA2t occurs from F0="H" and Fn="L". At this time, since FDA0c="H", FDA0t="L", FDA1c="H", FDA1t="L" and FDA2t="L", the outputs FDB0c="L", FDB0t="H", FDB1c="H", FDB1t="L", FDB2t="L" and FDB2cn="H". At this time, the shift indicating number="1".

Subsequently, addition similarly occurs every time Fp="H" and Fn="L", so that the values of FDB0c, FDB0t, FDB1c, FDB1t, FDB2t and FDB2cn vary. Furthermore, the number of the shift indicating numbers can be easily seen by assuming FDB2t, FDB1t and FDB0t as a three-digit binary number and by converting the binary number into a decimal number.

As described below, according to the above described preferred embodiments, 3-bit shift points are set for each of data input/output lines in order to carry out a data line shift for relieving a defective column. Thus, even if the number of simultaneously inputted/outputted I/O terminals is large, the number of the shift-controlling selecting signal lines passing through the region of the I/O lines can be less than the number of the I/O lines, so that the area penalty for controlling the data line shift can be small. In addition, since the number of the selecting signal lines can be constant regardless of the number of the I/O lines, the above described preferred embodiments are particularly effective in a multi-bit parallel input/output type memory, such as a logic consolidated DRAM.

In addition, while numbers of 0 to 7 represented by 3 bits have been used as shift points in the above described preferred embodiments, numbers represented by n bits (n is an optional positive integer) can be generally set.

In addition, in the above described preferred embodiments, the use of an electrical programming type fuse in the fuse circuit is particularly effective in the reduction of the pitch of the I/O lines, because wiring can pass over an electrical programming type fuse, whereas wiring can not pass over a laser programming type fuse since it is required to carry out laser irradiation.

Moreover, the present invention can not only be applied to DRAMs, but it can also be similarly applied to other semiconductor memories, such as SRAMs and EEPROMS.

As described above, according to the present invention, the shift indicating numbers, the number of which is smaller than the number of simultaneously inputted/outputted I/O terminals, are set for each of the data input/output lines in order to carry out the data line shift for relieving the defective column. Thus, it is possible to reduce the number of the shift-controlling selecting signal lines passing through the region of the I/O lines.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:
   a memory cell array having memory cells arranged in the form of a matrix;
   a redundant column cell array configured to relieve a defective column of said memory cell array;
   a decoder circuit configured to decode an address to select a memory cell in said memory cell array;
   a plurality of data lines, to which data read out from said memory cell array or data to be written in said memory cell array, corresponding to a plurality of columns, is transferred by said decoder circuit;
   a spare data line, to which data read out from said redundant column cell array or data to be written in said redundant column cell array is transferred;
   a data line shift circuit configured to shift, one by one, data lines and said spare data line, which are arranged on one side of a data line serving as a starting point, to which data of a defective column is to be transferred when the defective column is accessed, to connect said data lines and said spare data line to data input/output lines;
   a selecting circuit configured to store a correspondence between an address of said defective column and a shift point, which is assigned to each of said data input/output lines so as to increase by 1 of every starting point of the data line shift by said data line shift circuit, and output a selecting signal corresponding to said shift point when said address of said defective column is inputted; and
   a shift control circuit configured to output a shift control signal to said data line shift circuit by comparing said selecting signal, which is outputted from said selecting circuit, with said shift point.

2. A semiconductor memory device as set forth in claim 1, wherein said redundant column cell array comprising at least two portions, said two portions are provided on both sides of said memory cell array, and
   wherein if there are two defective columns of said memory cell array on right side and left side of said memory cell array, when said data line shift circuit shifts, one by one, said data lines arranged on one side of said data line serving as said starting point, to which said data of said defective column is to be transferred, said data line shift circuit shifts said data lines to the right with respect to one of said defective columns on the right side, and data lines to the left with respect to the other of said defective columns on the left side.

3. A semiconductor memory device as set forth in claim 1, wherein said shift points are $2^n$ numbers represented by n-bit binary data, and
   said selecting circuit has a selecting signal holding circuit, in which the number of column addresses x n selecting signal data is programmed and stored, and a column decoder circuit configured to decode an inputted column address to selectively output n-bit data serving as said selecting signal from said selecting signal holding circuit.

4. A semiconductor memory device as set forth in claim 1, wherein said shift points are $2^n$ numbers represented by n-bit binary data, and
   said shift control circuit has a shift indicating number holding circuit which is provided for each of said data input/output lines and in which said shift points are programmed and stored, and a determining circuit, provided for each of said data input/output lines, configured to compare an output of said shift indicating number holding circuit with said selecting signal outputted from said selecting circuit, to output said shift control signal.

5. A semiconductor memory device as set forth in claim 3, wherein said selecting signal holding circuit is a first fuse circuit having a fuse group, in which said selecting signal data is programmed, and a latch circuit, to which data of each fuse is transferred and in which the transferred data is held.

6. A semiconductor memory device as set forth in claim 4, wherein said shift control circuit outputs a different selecting signal which does not corresponds to said shift points held in said shift indicating number holding circuit, in the case of an address of a non-defective column.

7. A semiconductor memory device as set forth in claim 4, wherein said shift indicating number holding circuit is a second fuse circuit having a group of n fuses which are provided for each of said data input/output lines and in which said shift points are programmed, and a latch circuit, to which data of each fuse is transferred and in which the transferred data is held.

8. A semiconductor memory device as set forth in claim 4, wherein said shift indicating number holding circuit has a fuse circuit which is arranged outside of a wiring region for said data input/output lines, and a shift register, to which n-bit fuse data of said fuse circuit is sequentially transferred by turning ON a power supply and in which the transferred data is held for each of said data input/output lines.

9. A semiconductor memory device as set forth in claim 4, wherein said shift indicating number holding circuit includes:

a fuse circuit arranged outside of a wiring region of said data input/output lines;

a data converting circuit configured to sequentially convert each of n-bit fuse data of said fuse circuit to 1-bit data which is "1" at an increment position and "0" at other position;

a shift register, to which data obtained by said data converting circuit is sequentially transferred and in which the transferred data is held for each of said data input/output lines; and an adder, provided in each stage of said shift register, configured to restore n-bit fuse data at every stage.

10. A semiconductor memory device as set forth in claim 5, wherein said first fuse circuit includes an electrically programmed fuse.

11. A semiconductor memory device as set forth in claim 7, wherein said second fuse circuit includes an electrically programmed fuse.

12. A semiconductor memory device comprising:

a memory cell array having memory cells arranged in the form of a matrix;

a redundant column cell array for relieving a defective column of said memory cell array;

a decoder circuit for decoding an address to select a memory cell in said memory cell array;

a plurality of data lines, to which data read out from said memory cell array or data to be written in said memory cell array, corresponding to a plurality of columns, is transferred by said decoder circuit;

a spare data line, to which data read out from said redundant column cell array or data to be written in said redundant column cell array is transferred; and a data line shift circuit for shifting, one by one, data lines and said spare data line, which are arranged on one side of a data line serving as a starting point, to which data of a defective column is to be transferred when the defective column is accessed, to connect said data lines and said spare data line to data input/output lines;

which further comprises first means for establishing a correspondence between addresses and starting points for data line shift, and second means for establishing a correspondence between data input/output line numbers and starting points for data line shift, wherein said first and second means are used for determining a form of data line shift, which is carried out by said data line shift circuit, with respect to an inputted address.

13. A semiconductor memory device as set forth in claim 12, wherein said first and second means determine said starting points for data line shift by inputting addresses.

14. A semiconductor memory device as set forth in claim 13, wherein said first means comprises a selecting circuit for storing a correspondence between an address of said defective column and a shift point, which is assigned to each of said data input/output lines so as to increase by 1 every starting point of the data line shift by said data line shift circuit, and for outputting a selecting signal corresponding to said shift point when said address of said defective column is inputted, and said second means comprises a shift control circuit for outputting a shift control signal to said data line shift circuit by comparing said selecting signal, which is outputted from said selecting circuit, with said shift point.

15. A semiconductor memory device as set forth in claim 14, wherein said shift points are $2^n$ numbers represented by n-bit binary data, and said selecting circuit has a selecting signal holding circuit, in which the number of column addresses x n selecting signal data is programmed and stored, and a column decoder circuit for decoding an inputted column address to selectively output n-bit data serving as said selecting signal from said selecting signal holding circuit.

16. A semiconductor memory device as set forth in claim 14, wherein said shift points are $2^n$ numbers represented by n-bit binary data, and said shift control circuit has a shift indicating number holding circuit which is provided for each of said data input/output lines and in which said shift points are programmed and stored, and a determining circuit, provided for each of said data input/output lines, for comparing an output of said shift indicating number holding circuit with said selecting signal outputted from said selecting circuit, to output said shift control signal.

17. A semiconductor memory device as set forth in claim 15, wherein said selecting signal holding circuit is a first fuse circuit having a fuse group, in which said selecting signal data is programmed, and a latch circuit, to which data of each fuse is transferred and in which the transferred data is held.

18. A semiconductor memory device as set forth in claim 16, wherein said shift indicating number holding circuit is a second fuse circuit having a group of n fuses which are provided for each of said data input/output lines and in which said shift points are programmed, and a latch circuit, to which data of each fuse is transferred and in which the transferred data is held.

19. A signal line shifting method for a semiconductor memory device which comprises a memory cell array, a redundant column cell array, first signal lines corresponding to said memory cell array, and a second signal line corresponding to said redundant column cell array, wherein when said signal line shifting method shifts, one by one, first signal lines, which are arranged on one side of a first signal line serving as a starting point corresponding to a defective column when the defective column is accessed, to connect said first signal lines and said second signal line to input/output lines, said signal line shifting method comprises the steps of:

establishing a correspondence between addresses and starting points for signal line shift;

establishing a correspondence between input/output line numbers and said starting points for signal line shift; and inputting a predetermined address to compare said correspondences with each other to determine a form of signal line shift on the basis of the compared result.

20. A signal line shifting method as set forth in claim 19, wherein said starting point for signal line shift is a point at which shift point information of each of said input/output lines is coincident with information on said starting points for signal line shift which correspond to said addresses.

* * * * *